(12) United States Patent
Gheewala (10) Patent No.: US 6,991,947 B1
(45) Date of Patent: Jan. 31, 2006

(54) HYBRID SEMICONDUCTOR CIRCUIT WITH PROGRAMMABLE INTRACONNECTIVITY

(75) Inventor: Tushar Gheewala, 501 Castano Corte, Los Altos, CA (US) 94022

(73) Assignee: Tushar Gheewala, Los Altos, CA (US)

( * ) Notice: Subject to any disclaimer, the term of this patent is extended or adjusted under 35 U.S.C. 154(b) by 2 days.

(21) Appl. No.: 10/806,752

(22) Filed: Mar. 22, 2004

(51) Int. Cl.
*H01L 21/50* (2006.01)

(52) U.S. Cl. .................. 438/15; 438/109; 257/723; 326/47; 326/41

(58) Field of Classification Search .................. 326/9, 326/10, 14, 15, 47, 101, 37, 41; 438/15, 438/109; 257/686, 723, 777
See application file for complete search history.

(56) References Cited

U.S. PATENT DOCUMENTS

| | | | |
|---|---|---|---|
| 5,798,282 A | * | 8/1998 | Bertin et al. .................. 438/15 |
| 5,946,545 A | | 8/1999 | Bertin et al. |
| 6,545,501 B1 | * | 4/2003 | Bailis et al. .................. 326/10 |
| 6,614,267 B2 | | 9/2003 | Taguchi |
| 6,627,985 B2 | | 9/2003 | Huppenthal et al. |
| 6,861,865 B1 | * | 3/2005 | Carlson ....................... 326/10 |

* cited by examiner

*Primary Examiner*—Vibol Tan
(74) *Attorney, Agent, or Firm*—Townsend and Townsend and Crew LLP (57) ABSTRACT

Field programmable circuits and redundant logic are added to the substrate of a hybrid circuit with functionality to bypass and/or repair unusable dies in order to enhance yield and lower costs of manufacture. In a preferred embodiment, a collar of programmable logic is inserted between the functional component on the hybrid die and its I/O terminals. The programmable logic collar can be programmed after hybrid assembly and test in order to correct assembly errors or die failures through one or more of the following actions: switch between redundant functional units and I/Os on the hybrid die; switch between redundant IC dies on the substrate, invert signal polarity; correct crosstalk errors; perform test and fault isolation.

14 Claims, 9 Drawing Sheets

HYBRID SEMICONDUCTOR CIRCUIT WITH PROGRAMMABLE INTRACONNECTIVITY

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

This invention relates to the manufacturing techniques for hybrid semiconductor integrated circuits and structures made in accordance with those techniques.

Figure 1A:
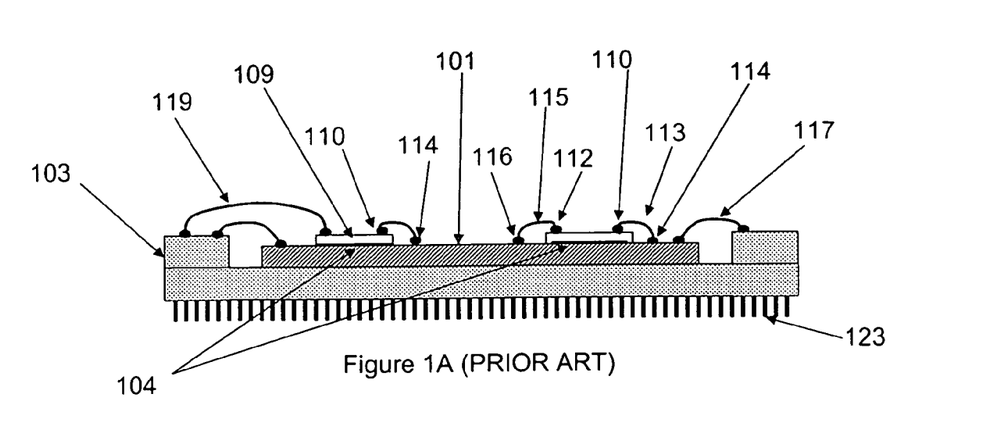
FIGS. 1A and 1B are views of a representative prior art hybrid structure.
Figure 1B:
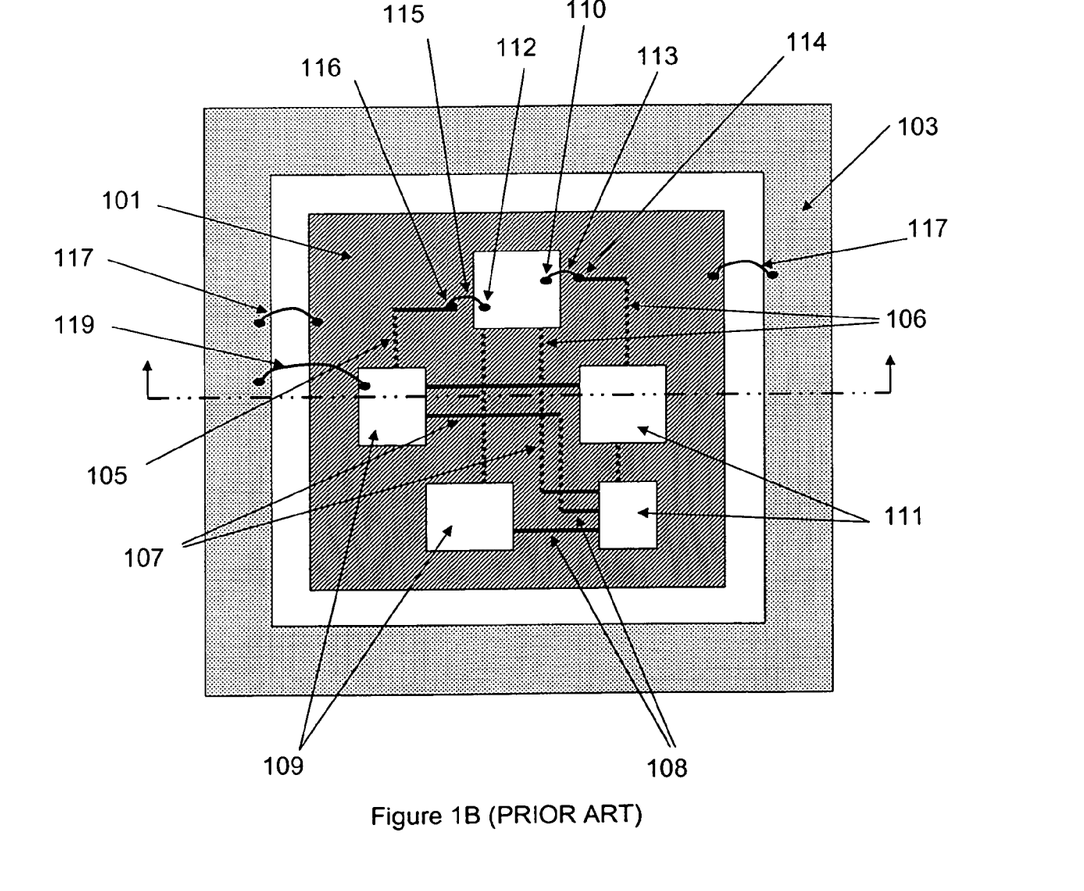

Hybrid circuits have been widely used in the electronic systems industry for over 40 years. FIG. 1A and FIG. 1B illustrate the basic features of a hybrid circuit. It includes a substrate 101 mounted inside an enclosure or package 103, and the substrate 101 has interconnect traces 105–108 in the substrate 101 and integrated circuit (IC) dies 109, 111 on the substrate 101. The IC dies 109, 111 are glued or otherwise bonded to the substrate 101 using a die attach epoxy and electrically connected to the interconnect traces by means of wire bonds 113, 115 extending from substrate pads 114, 116 on the substrate 101 to die pads 110, 112 on the dies 109, 111. Wire bonds 117 are used to connect the substrate to the package. In addition, wire bonds 119 may be used to connect the IC dies directly to the edge of the package 103. Finally, the package has pins 123 that facilitate the package connection to other packages and printed circuit boards.

Many variations of the above scheme are practiced which makes hybrid circuit a very versatile methodology for integrating complex systems. For example, the substrate could be made of a printed circuit board, a multi-layer ceramic or a silicon chip with integrated devices such as transistors, resistors and capacitors. The IC die-to-substrate connection (or the substrate-to-package connections) can be formed by many alternate means than wire bonds. Solder balls and flat metal fingers (TABs) are also used for the same purpose. Similarly, the package pins 123 may be formed by solder balls or TABs. In addition to IC die, passive components such as capacitors, inductors, and crystals may be glued onto the substrate and connected to the interconnect traces using wire bonds or other means.

As a general background, reference is made to Rao Tummala, "Fundamentals of Micro-system Packaging," (McGraw-Hill, 2001.), which summarizes the current state-of-art in hybrid circuit packaging.

The main benefit of hybrid arises from its versatility. One can combine diverse IC functions such as analog, digital, microwave and memories from different sources on a single assembly without incurring the cost and volume of packaging each individual IC die. One can also combine diverse semiconductor technologies in a single assembly such as GaAs, ferro-electric and silicon. In addition the design cost for hybrids is considerably less than that of a comparable single IC solution.

However, there are serious cost issues with hybrids which limit their use to niche markets. The biggest negative is lower yield. Even if a single one of the many ICs on the hybrid fails, it renders the entire hybrid unusable, resulting in low yield and high costs. Removal and replacement of the defective die is expensive, error-prone and time consuming. A further disadvantage is that wire bond (and alternates such as solder ball) connections between IC dies and the substrate are large in comparison with on-chip interconnect technologies. This makes the area of the IC die and the substrate much larger than their single chip counterparts. A still further problem is related to the high cost of inventorying IC dies. In spite of these negatives, hybrids are successfully built and used and are widely employed many electronic systems.

Some hybrid circuits include programmable logic ICs on the substrates. However, such attempts have been intended to provide more flexibility in the functionality of the hybrids and are not directed towards solving the manufacturing issues. In U.S. Pat. No. 6,627,985 entitled "Reconfigurable processor module comprising hybrid stacked integrated circuit die elements" the inventors disclose the use of a field programmable gate array (FPGA) as an IC die. However, it does not teach the use of such programmable logic to improve assembly yield or reduce the cost of inventorying the IC dies. In U.S. Pat. No. 6,614,267 entitled "Electronic circuit device and hybrid integrated circuit with an ASIC and an FPGA" the inventors teach the use of a programmable FPGA die to create a "hybrid integrated circuit in which the specification can quickly be modified and adjusted without preparing a new mask and without compromising the performance of the hybrid integrated circuit". However, there is no teaching of use of such programmable logic to improve assembly yield or to reduce the cost of inventorying the IC dies. U.S. Pat. No. 5,946,545 entitled "Semiconductor stack structures and fabrication/sparing methods utilizing programmable spare circuit" teaches the use of spare memory chips to repair defective hybrid circuits without costly reassembly. However, the methodology is not applicable to other types of functionalities such as logic. The prior art also does not teach the use of inclusion of redundant logic and I/Os on the IC die to improve yield and lower costs.

What is needed is a mechanism for dealing with potentially defective IC dies that does not require reassembly.

SUMMARY OF THE INVENTION

According to the invention, field programmable circuits and redundant logic are added to the substrate of a hybrid circuit with functionality to bypass unusable dies in order to enhance yield and lower costs of manufacture. In a preferred embodiment, a collar of programmable logic is inserted between the functional component on the hybrid die and its I/O terminals. The programmable logic collar can be programmed after hybrid assembly and test in order to correct assembly errors or die failures through one or more of the following actions: switch between redundant functional units and I/Os on the hybrid die; switch between redundant IC dies on the substrate, invert signal polarity; correct crosstalk errors; perform test and fault isolation. The programmable collar enables repair of defective hybrids without expensive rework, and it reduces the cost of inventorying many IC dies.

Hybrid circuits according to the invention are an effective alternative to system-on-chip designs because they offer low engineering costs and a wide choice of functionality without the disadvantage of higher production costs due to lower yields and expensive repairs.

The invention will be better understood by reference to the following detailed description taken with the accompanying drawings.

DETAILED DESCRIPTION OF SPECIFIC EMBODIMENTS OF THE INVENTION

Figure 2:
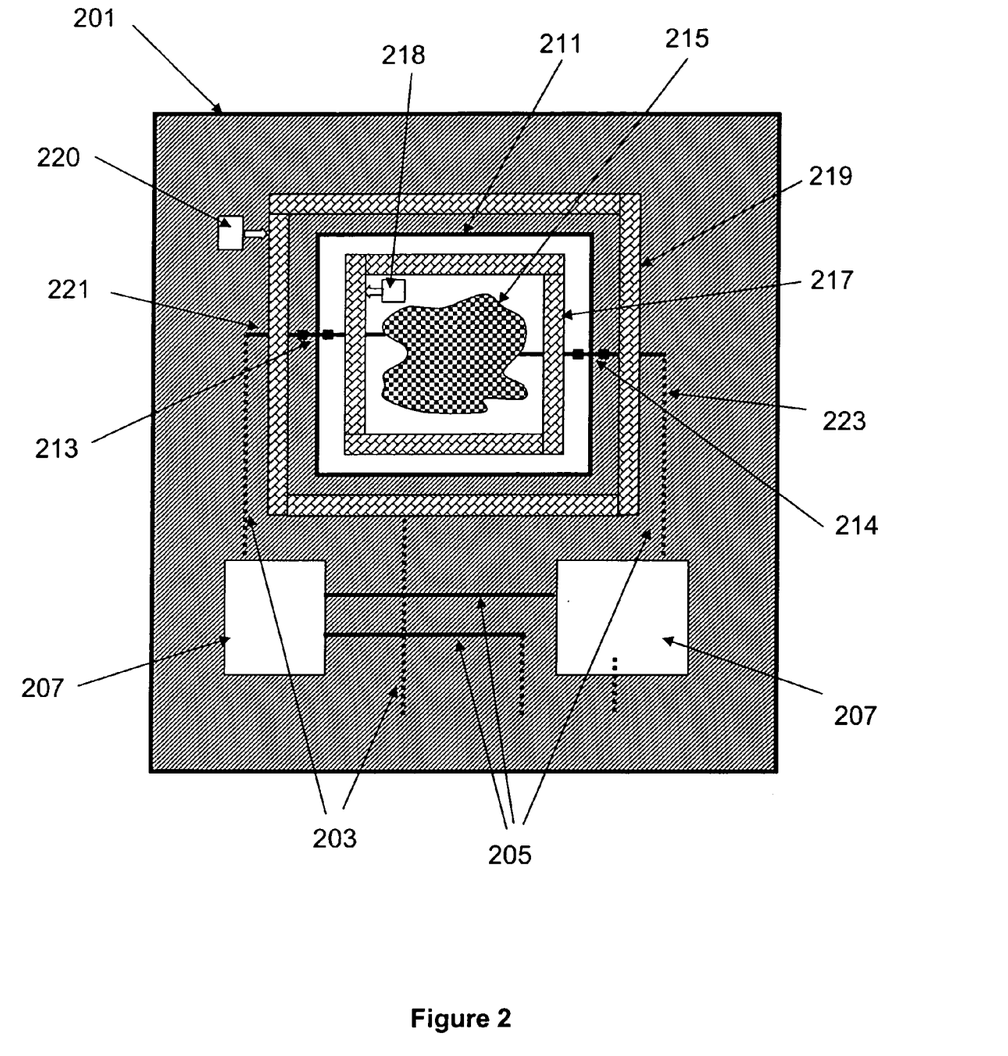
FIG. 2 is a top view of a hybrid circuit according to the invention.

FIG. 2 illustrates a specific embodiment of the invention in a hybrid substrate 201 comprising interconnect traces 203, 205 and IC dies 207, 211 that have circuits within IC die 211. (The packaging surrounding the hybrid device is not shown for purposes of clarity.) IC dies are electrically connected to the interconnect traces 221, 223 by means of representative wire bonds 213, 214. An embedded functional unit (EFU) 215 is a circuit block that provides the logical functionality of the IC die 211. According to the invention, a programmable logic section 217 is designed into and thus added to the IC die 211 itself. Alternatively, an optional programmable logic section or collar 219 is placed outside of the IC die 211 with direct coupling in between. Further alternatively, the external programmable collar 219 may be used without any internal programmable circuits 217. The programmable logic is controlled by control units 218 and 220 which receive external instructions and use them to reprogram the functionality and connectivity of the programmable logic. The programmable sections intercept signals on the interconnections 221, 223 connecting EFU 215 to the other parts of the hybrid circuit, enabling a tester or even an end user to modify interconnectivity and functionality without expensive redesign or reassembly.

Figure 3:
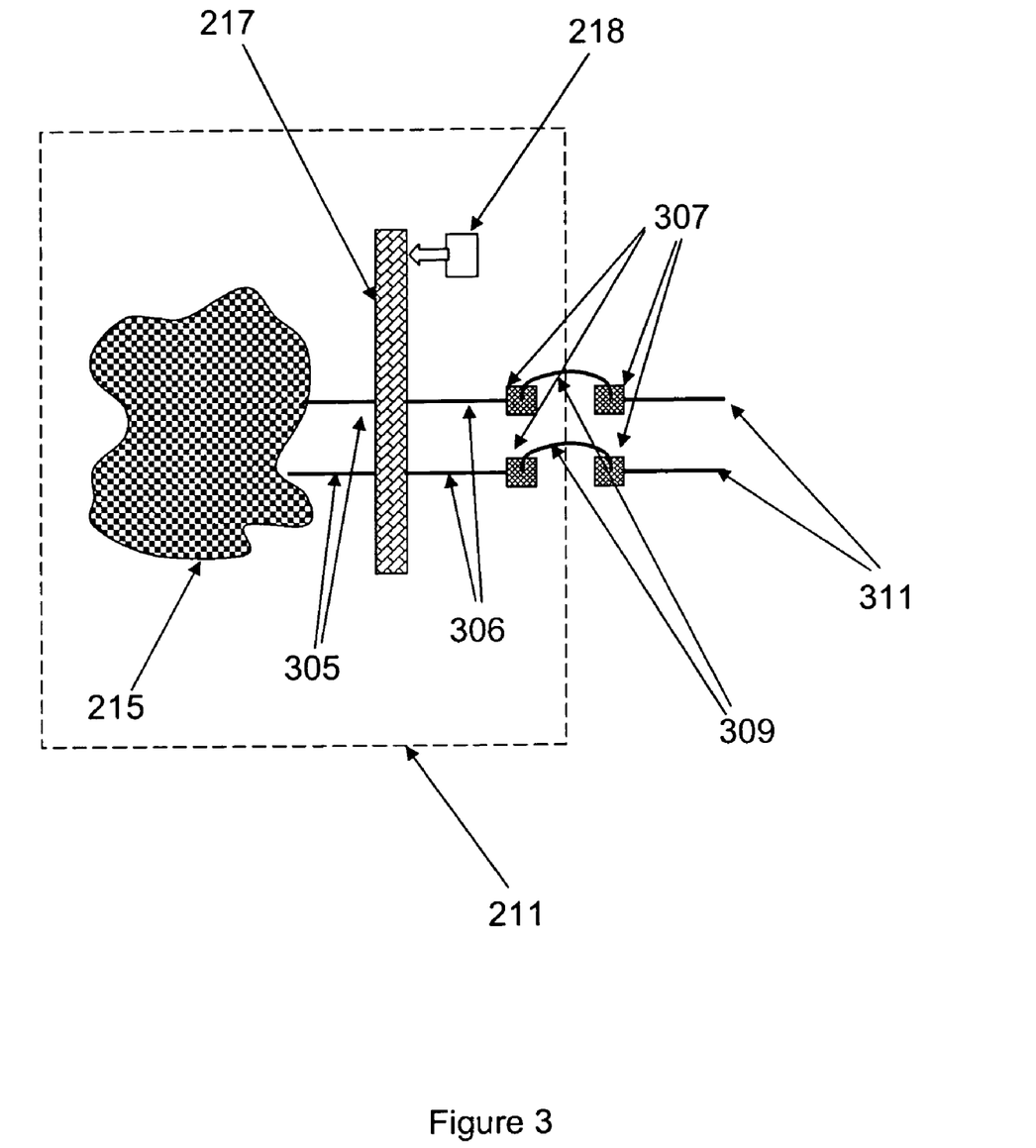
FIG. 3 is a top view in detail of a first functional structure in accordance with the invention.

A more detailed schematic of the above arrangement is shown in FIG. 3. It shows an expanded view of the IC die 211 containing the EFU 215 and the programmable collar 217. Interconnects formed by elements 305, 306, 309, and 311 are illustrative connections between EFU 215 and the hybrid substrate. In the prior art, an EFU is directly connected to the wire-bond pads 307 via wire-bonds 309. However, in the current invention, signals pass through a programmable logic section 217 (also forming a collar around the circuitry to be protected) under supervision of a control unit 218 before connection to the hybrid substrate. Once on the substrate, the interconnect 311 is coupled to a destination as before, where it may or may not pass through one or more programmable collars.

Figure 4:
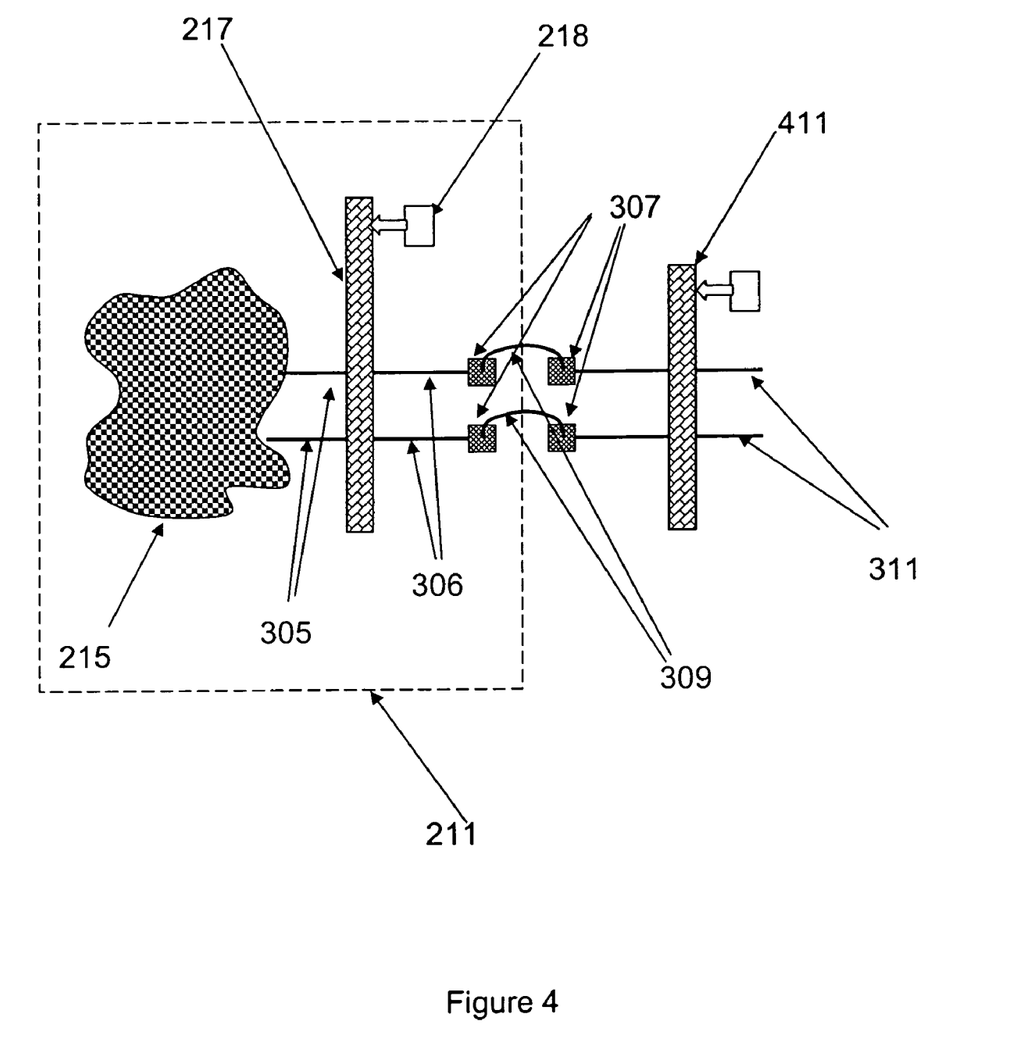
FIG. 4 is a top view of a second functional structure in accordance with the invention.

Another embodiment of the current invention is shown schematically in FIG. 4. In this case an additional programmable logic element, namely a slice 411, is placed on the substrate, in the path of the wire-bond pads 307 and interconnects 311. The rest of the components are as in FIG. 3. The programmable collar (not shown) on the substrate intercepts the hybrid interconnectivity and permits a tester or a user to reprogram it to repair errors. This arrangement is practical when an active substrate such as silicon is used, since it can incorporate circuitry. In alternate embodiments of the present invention, a programmable collar 411 may be included only on the substrate and not on the IC die, in which case the illustrative examples discussed hereafter would apply to the external collar equally.

The programmable logic includes switches and multiplexers that can interrupt and redirect interconnect signals, combinational logic to enhance the functionality of the EFU, delay elements to correct timing problems, line terminating resistors of different values, power supply filtering components, and storage elements to store instructions and signals. Additionally, it includes control logic which is controlled via control pins that are connected to external control circuits. The control circuit may lie outside of the hybrid package or on the hybrid substrate itself. The external controller sends instructions to the control unit to modify the electrical and Boolean properties of the programmable logic to correct errors that cause the hybrid assembly to fail. Thus a failed hybrid can be repaired without reassembly, resulting in higher yield. Some examples of such corrective actions are discussed below.

Figure 5:
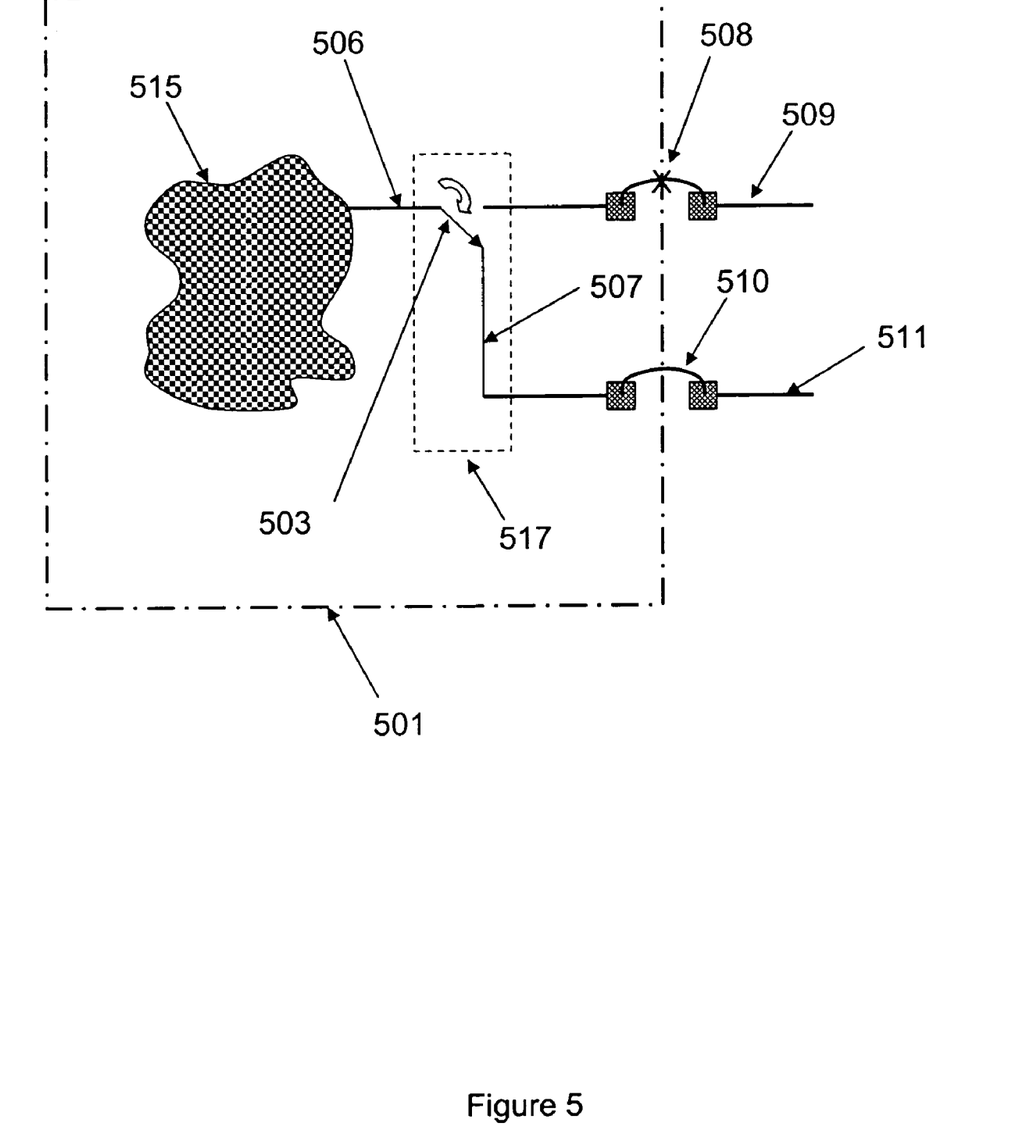
FIG. 5 is a top view of a third functional structure in accordance with the invention.

FIG. 5 is an illustration of an example of how the programmable logic collar 517 is used to repair a defective connection 508 between an EFU 515 inside a die 501 and a hybrid substrate. It is a fairly common mode of failure for a wire-bond or a solder ball connection between a die and the substrate to be either open or shorted. As illustrated in FIG. 5, the programmable logic 503 is instructed to switch off the defective path 506-508-509 and to deliver the signal to an alternate interconnect 511 via the alternate path 506-507-510-511. A small number of redundant paths such as 511 are pre-designed as per the teachings of this invention for such repairs. The signal diverted to the interconnect 511 can be routed back (not shown for clarity) to the original destination of interconnect 509 by the use of similar programming on either the substrate 501 or on a receiving IC die.

Figure 6:
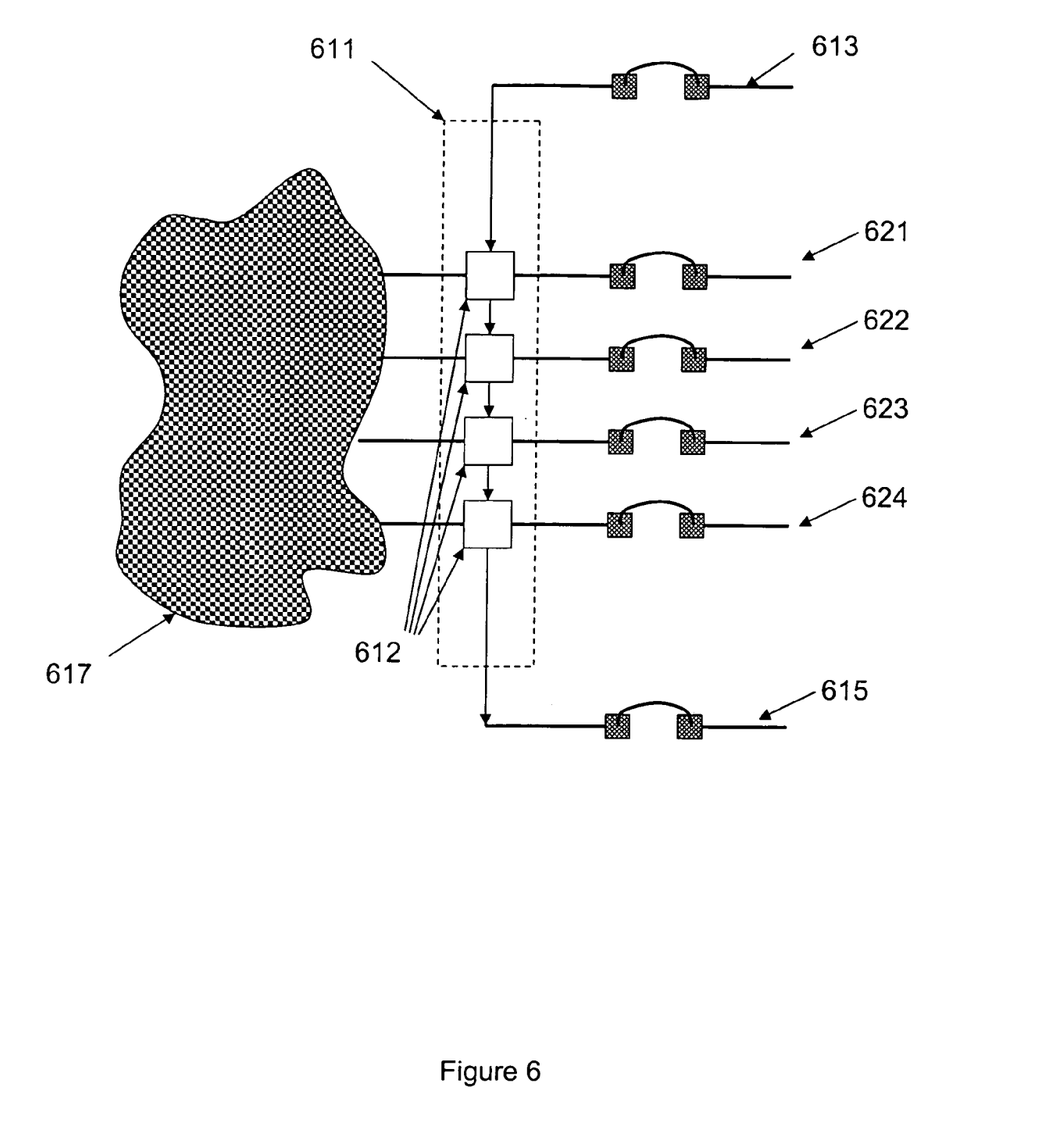
FIG. 6 is a top view of a fourth functional structure in accordance with the invention.

Another notable cause of failure is the inability to adequately test an IC die that is buried deep inside the hybrid. It is difficult to reach the I/O ports of the chip to be tested. Referring to FIG. 6, with the programmable collar 611 as envisioned by the present invention, access to the inputs and outputs 621–624 of the die can be achieved readily. As shown in FIG. 6, the programmable logic is instructed to create a shift register including flip-flops 612 that intercepts the I/O signals, providing desired test signals to the inputs of the EFU 617 and capturing the resultant output signals to verify proper functionality of the EFU 617. Test patterns are scanned in and out of the shift register using data pins 613 and 615. (Control pins that operate the shift register and program the programmable logic are not shown for clarity.) Test patterns can then be applied and observed directly at the boundary of the EFU 617 using boundary scan techniques that are well known in the art, making it possible to test the function adequately.

Figure 7:
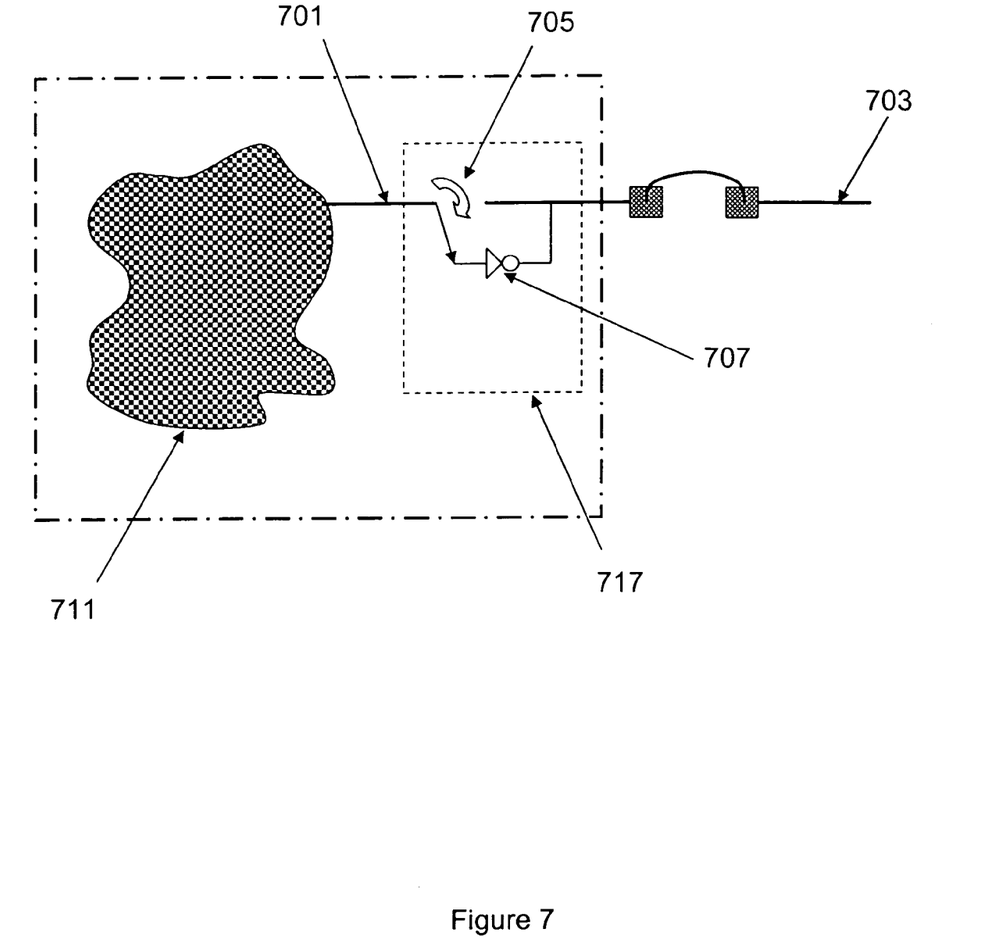
FIG. 7 is a top view of a fifth functional structure in accordance with the invention.

A further example illustrated in FIG. 7 shows how simple design errors can be corrected by a programmable logic collar 717. In this case, the output signal 703 of EFU 711 needs logical inversion for correct operation. This is achieved in two programming steps using the present invention, without the need to redesign the hybrid. In the first step, the existing electrical path 701–703 is blocked by opening programmable switch 705. In the second step, an alternate path 701-707-703 is electrically connected to the output 703. The new path includes an inverter 707 which corrects the logical error without requiring expensive redesign and reassembly. The inverter is among the spare logic gates available on the programmable logic 717 which can also be programmed to perform other simple logic functions such as NAND or XOR.

Timing errors in hybrid designs can be similarly repaired In this case, a delay element is either inserted or removed to correct a timing problem in place of the inverter.

Figure 8:
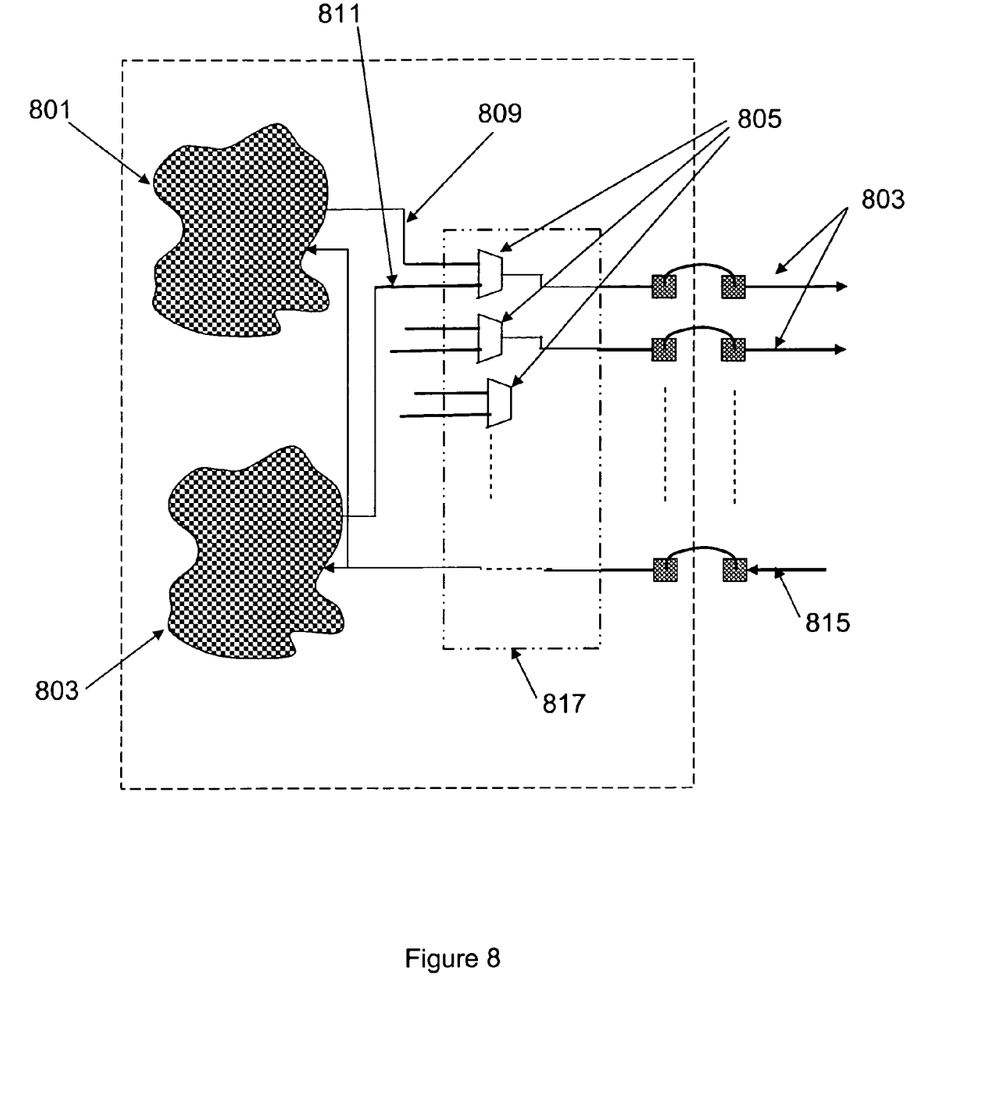
FIG. 8 is a top view of a sixth functional structure in accordance with the invention.

FIG. 8 illustrates another application of the present invention to reduce hybrid circuit manufacturing costs. In the current art, if just one IC die on the hybrid is defective, the entire hybrid has to be discarded, even if the remainder of the IC dies and substrate are good. In order to reduce this cost risk, according to the teachings of this invention, two identical EFUs 801 and 803 are included on the same IC die. The cost of including a second EFU on the IC die is usually small, since most of the area of the die is for I/O. If an IC die fails test because of a defect in EFU 801, the second EFU 803 can be electrically substituted for the defective one to repair the defect. This is achieved by reprogramming the programmable collar 817. Programmable multiplexers 805 are included in the programmable collar 817 which can be programmed to direct one of the two input signals to its output. In order to use EFU 803 in place of EFU 801, the multiplexers are programmed to deselect input 809 and select 811 instead. Only the outputs of EFU 803 are observed at the die output pins 807.

Inputs 815 are usually applied to both the EFUs 801, 803, so no multiplexing is necessary in this circuit path. However, in some applications where power dissipation is important, one may include programmable multiplexers on the input side of EFUs also. Further, power supplies and clock input to the unused IP may be shut down in power sensitive applications by programming switches in the programming collar 817. The yield of the hybrid circuit can be significantly enhanced with this approach, resulting in much lower cost.

Figure 9:
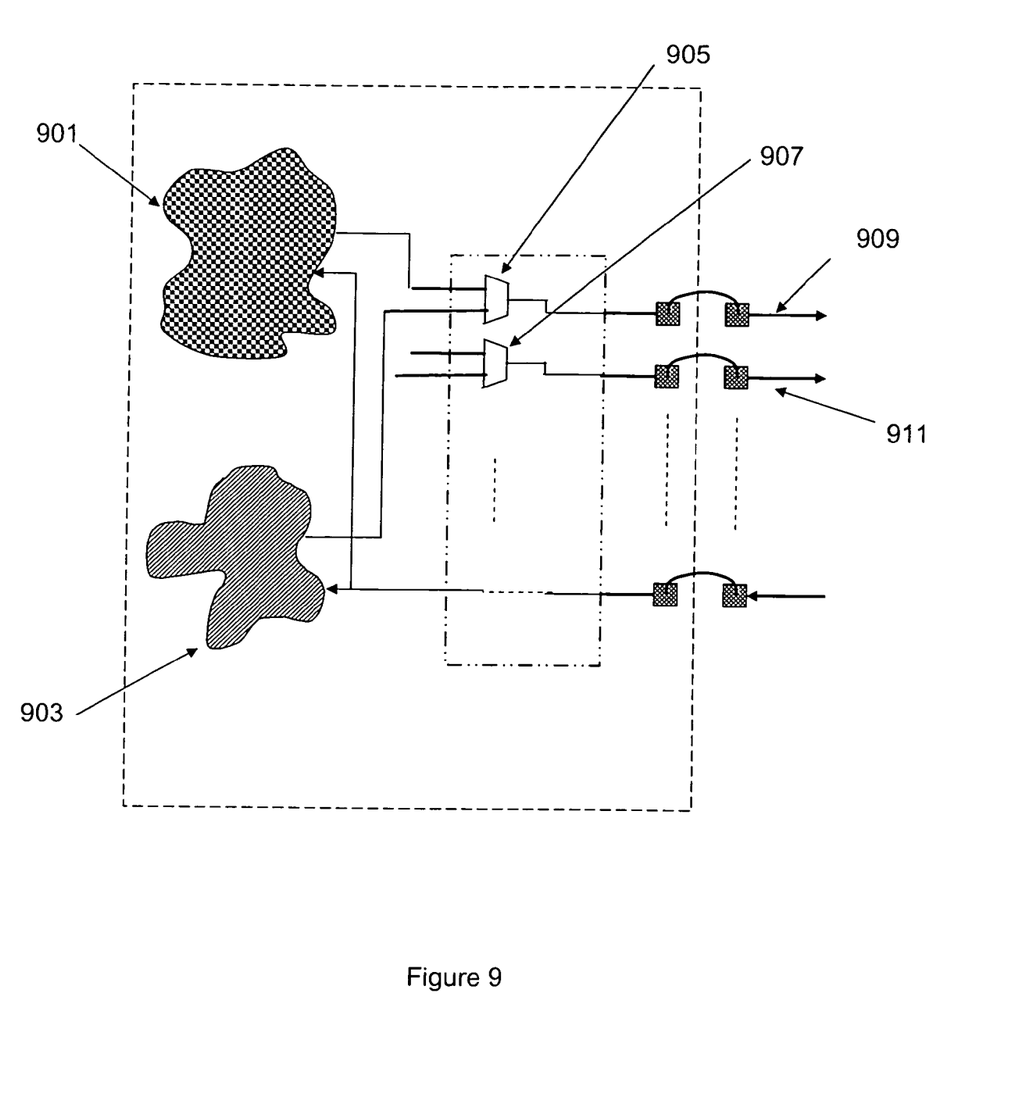
FIG. 9 is a top view of a seventh functional structure in accordance with the invention.

A further example of the benefits of the present invention is shown in FIG. 9. The two EFUs 901 and 903 represent different functionalities. Two or more EFUs are embedded in a single IC die, and a subset is made available to the user by setting the multiplexers 905, 907 appropriately to connect the desired EFUs to the external I/Os 909, 911. This approach reduces the number of IC dies the manufacturer must hold in inventory and hence the cost of the hybrid circuit. For example, by packaging three different EFUs on a single die, the manufacturer can reduce the number of parts in his inventory by a factor of three. Once again, this is practical in advanced generations of semiconductor technologies where the die area required for I/Os is significantly larger than that for the EFUs.

The invention has been explained with reference to specific embodiments. Other embodiments will be evident to those of ordinary skill in the art. Therefore, it is not intended that the invention be limited other than as indicated by the appended claims.

What is claimed is:

1. A hybrid circuit comprising
   a substrate;
   interconnects on said substrate;
   a first IC die with electrical functionality, said first IC die being attached to said substrate and having input and output signal leads connected to the said interconnects via bonding mechanisms; and
   programmable logic on said IC die, wherein
      said programmable logic is operative to intercept selected ones of communication signals between said IC die and said substrate, wherein
      said programmable logic is operative in response to external control signals applied to said programmable logic, and
      said control signals are operative to modify electrical functionality and connectivity of inputs and outputs connected to said programmable logic.

2. The hybrid circuit according to claim 1 wherein said substrate includes active devices.

3. The hybrid circuit according to claim 2 wherein said substrate includes programmable logic.

4. The hybrid circuit according to claim 3 wherein said programmable logic is disposed to intercept said interconnects.

5. The hybrid circuit according to claim 1 further including redundant inputs and outputs on the same IC die.

6. The hybrid circuit according to claim 1 wherein said IC die contains at least two electrical functional units; and wherein
   said programmable logic is operative to select one of the two electrical functional units for connection to external outputs of the die under the control of control signals.

7. The hybrid circuit according to claim 6 wherein said two functional electric functional units are substantially identical in functionality.

8. The hybrid circuit according to claim 7 wherein said substrate includes active circuitry.

9. The hybrid circuit according to claim 6 wherein power control is provided which is operative to switch off power supply to a single one of said electrical functional units.

10. The hybrid circuit according to claim 6 wherein said substrate further includes active circuitry.

11. The hybrid circuit according to claim 6 wherein said control circuit is operative to selectively cut off clock input to at least one said electrical functional unit.

12. A hybrid circuit comprising:
    a substrate;
    interconnects on said substrate;
    an IC die on said substrate, said IC die having at least two functional units and control logic connected to output terminals of said functional units and connected to input/output terminals of said IC die, wherein said control logic is responsive to external control signals applied to said control logic and said control signals are operative to modify electrical functionality and connectivity of inputs and outputs connected to said control logic; and
    said control logic being operative to connect outputs of one selected functional unit to selected input/output terminals of the IC die.

13. The hybrid circuit according to claim 12 wherein said two functional units are of identical functionality.

14. A method for routing signals within a hybrid circuit on a substrate, said substrate having interconnects on said substrate, a first IC die with electrical functionality, said first IC die being attached to said substrate and having input and output signal leads connected to the said interconnects via bonding mechanisms, a second IC die with electrical functionality, said second IC die being attached to said substrate and having input and output signal leads connected to the said interconnects via bonding mechanisms, and programmable logic on said IC die, the method comprising:

intercepting via said interconnects selected communication signals between said first IC die and said substrate; and switching signal lines via said programmable logic between first IC die and said second IC die.

* * * * *